US007558303B2

(12) United States Patent
Lupo

(10) Patent No.: US 7,558,303 B2
(45) Date of Patent: Jul. 7, 2009

(54) MOUNTING ARRANGEMENT FOR HIGH-FREQUENCY ELECTRO-OPTICAL COMPONENTS

(75) Inventor: Silvio Lupo, Turin (IT)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 202 days.

(21) Appl. No.: 10/636,167

(22) Filed: Aug. 7, 2003

(65) Prior Publication Data

US 2004/0120370 A1   Jun. 24, 2004

(51) Int. Cl.
*H01S 3/00* (2006.01)

(52) U.S. Cl. .................................. 372/38.02; 372/38.01

(58) Field of Classification Search ................ 372/34, 372/36, 38.02
See application file for complete search history.

(56) References Cited

U.S. PATENT DOCUMENTS

| 4,761,788 | A   |   | 8/1988  | Dietrich et al. |              |
|-----------|-----|---|---------|-----------------|--------------|
| 5,436,920 | A   | * | 7/1995  | Minemoto et al. | 372/21       |
| 5,636,235 | A   | * | 6/1997  | Miyazaki        | 372/44.011   |
| 5,646,763 | A   | * | 7/1997  | Misaizu et al.  | 398/197      |
| 5,694,048 | A   | * | 12/1997 | Boudreau et al. | 324/752      |
| 5,734,672 | A   | * | 3/1998  | McMinn et al.   | 372/50.12    |
| 5,737,349 | A   | * | 4/1998  | Gaebe           | 372/37       |
| 5,781,578 | A   | * | 7/1998  | Takagi          | 372/50       |
| 5,854,867 | A   | * | 12/1998 | Lee et al.      | 385/49       |
| 5,995,476 | A   | * | 11/1999 | Kim             | 369/112.1    |
| 6,101,202 | A   | * | 8/2000  | Kosugi          | 372/36       |
| 6,181,717 | B1  | * | 1/2001  | Kner et al.     | 372/20       |
| 6,186,399 | B1  | * | 2/2001  | Stern et al.    | 235/462.01   |
| 6,219,364 | B1  | * | 4/2001  | Dei             | 372/36       |
| 6,327,287 | B1  | * | 12/2001 | Kner et al.     | 372/43       |
| 6,384,442 | B1  | * | 5/2002  | Chen            | 257/298      |
| 6,567,439 | B1  | * | 5/2003  | Auracher et al. | 372/36       |
| 6,781,727 | B2  | * | 8/2004  | Auracher et al. | 398/163      |
| 2001/0010536 | A1 | * | 8/2001 | Katzir et al.   | 347/255      |
| 2002/0048295 | A1 | * | 4/2002 | Kato et al.     | 372/36       |
| 2002/0085598 | A1 | * | 7/2002 | Shaw            | 372/36       |
| 2002/0121863 | A1 | * | 9/2002 | Morishita       | 315/169.3    |
| 2002/0163943 | A1 | * | 11/2002 | Lano et al.    | 372/29.02    |

FOREIGN PATENT DOCUMENTS

| DE | 4036896  | 2/1992 |
|----|----------|--------|
| JP | 03076185 | 2/1991 |
| JP | 07122808 | 2/1992 |
| JP | 05110201 | 4/1993 |

* cited by examiner

*Primary Examiner*—Minsun Harvey
*Assistant Examiner*—Phillip Nguyen

(57) ABSTRACT

An auxiliary component such as a bias inductance (6) associated with a laser source (2) is mounted generally "upright", that is with its major dimension substantially orthogonal to the general plane of the submount (S) supporting both the laser (2) and the auxiliary component (6). The inductor (6) is preferably mounted at a location displaced laterally with respect to the lasing direction (X) of the laser source. The arrangement preferably includes a submount (S) with a recess (13) and at least part of the laser driver is arranged in the recess so that the driver (3) has an end surface extending from the recess substantially flush with the pad (12) for mounting the laser source. The arrangement minimises surface occupation as well as RF and EMI parasitic effects related to wirebonding.

7 Claims, 2 Drawing Sheets

MOUNTING ARRANGEMENT FOR HIGH-FREQUENCY ELECTRO-OPTICAL COMPONENTS

FIELD OF THE INVENTION

Figure 1:
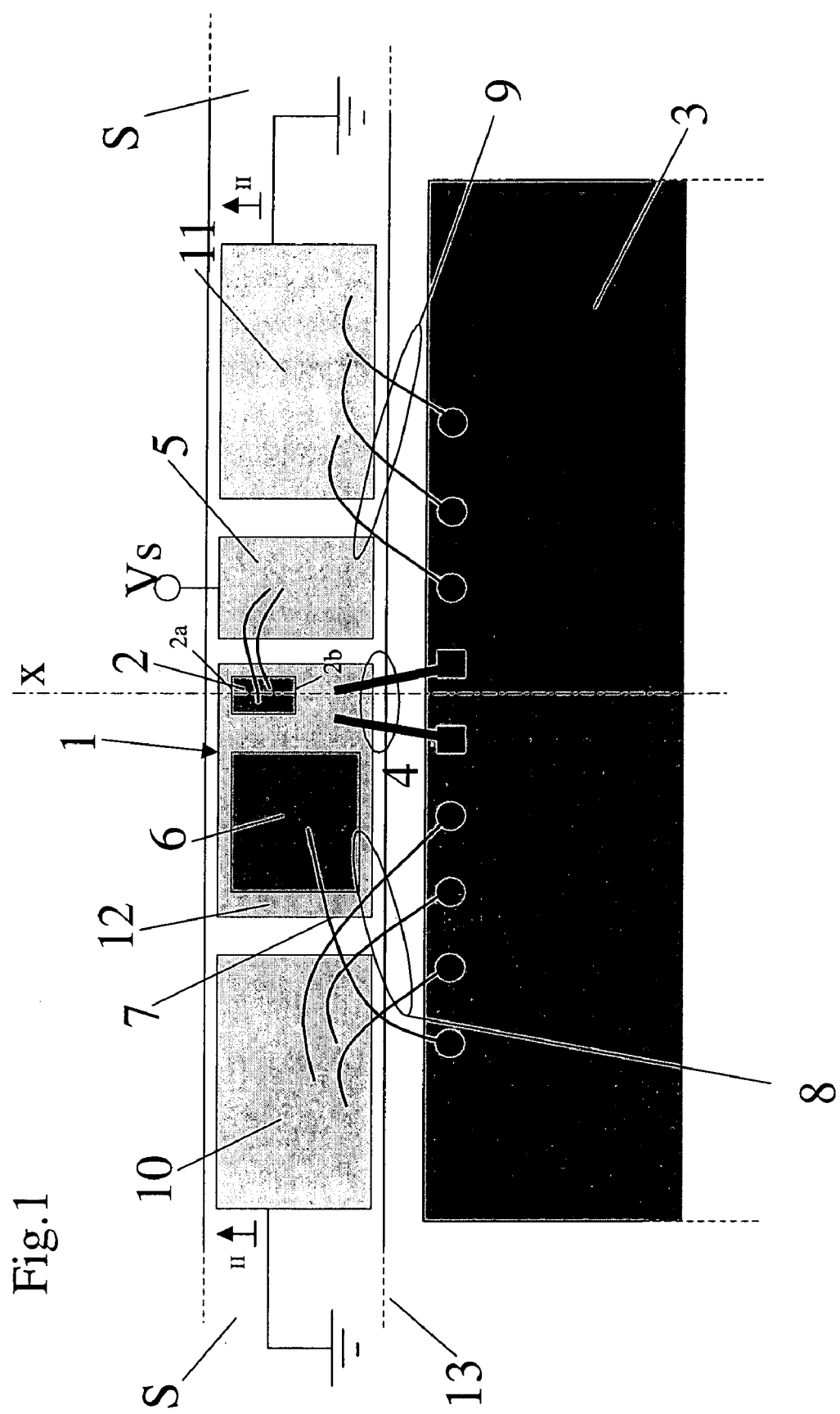

The present invention relates to mounting arrangements for high-frequency electro-optical components. Exemplary of such components are semiconductor laser sources for optical communications and the bias/driver circuitry currently associated with such sources.

DISCUSSION OF THE BACKGROUND ART

A standard mounting arrangement adopted for electronic components such as integrated circuits (IC's) includes a flat base member or board (submount) having electrical connections provided on at least one of its surfaces in the form of metallic areas such as metallic strips or pads.

Various techniques may be resorted to in order to connect the components to such strips/pads. These techniques may include providing the components with leads or pins for soldering to the conductive strips/pads or more sophisticated solutions such as "flip-chip" bonding, SMD technology, possibly including the use of electrically conductive glues, and the like.

Such prior art solutions are essentially based on a two-dimensional or bi-dimensional layout, where the lengths and widths of the components limit the number of components for surface unit. This may lead to fairly penalizing situations in terms of submount area occupied, even if small size SMD components and compact layouts and assemblies are used.

Also, optimisation of RF performance is severely hampered as the layout may be influenced by e.g. passive components used for bias networks.

In operation at very high frequencies (in the range of 10 Gbit/s and above) in connection with opto-electronic components such as semiconductor laser sources, the need is strongly felt of reducing inasmuch as possible the wirebonding length, while also simplifying the geometry of connections provided at the submount level.

Additional requirements arise as a result of the presence of the opto-electrical components. For instance, semiconductor lasers have a main or front facet from which a laser beam is generated that is to be injected into an optical waveguide along a substantially unimpeded propagation path. Such semiconductor lasers also currently have a back facet from which a secondary laser beam is produced. The secondary laser beam may be collected and detected by an opto-electrical component, such as a photodiode, e.g. for control purposes. Undesired back reflection of such secondary laser beam towards the laser source must be avoided as this may interfere with proper laser operation.

An environment where the problems outlined in the foregoing are particularly evident is an integrated optical transmitter, including a laser diode and a laser driver as the basic components.

In the presence of a laser capacitance of 1 or 2 pF and a capacitance of the output pads of the laser driver of a few pF, a parasitic inductance due to the connections between the laser diode and the laser driver of, say, 1 nH may generate a resonance frequency within the signal band, thus producing distortion and a penalty in terms of the system bit error probability (BER).

A very small clearance must be kept between the pad for mounting the laser diode and the laser driver, so that the corresponding wirebonding is as short as possible, preferably less than 1 mm. Similarly, the ground connections of the laser driver include parasitic inductances that may affect the behaviour of the assembled circuit and must be kept as low as possible.

Also, the circuit must include a laser bias network generally comprised of at least one SMD inductor. Such an inductor is intrinsically a rather "obtrusive" component in comparison with the laser source and the other auxiliary components located in the vicinity thereof. The inductor may be e.g. a SMD component in the form of a parallelepiped about 1-1.5 mm i.e. 1,500 micron long and roughly square end faces having sides about 500-750 micron long. This contrasts with the laser dimensions being typically in the range of 300×200 micron base area with a thickness of e.g. 90 microns.

In order to be truly effective, the bias inductance has to be positioned in the close vicinity of both the laser diode and the laser driver, which strongly penalises the designer's freedom in devising the circuit geometry.

The object of the present invention is thus to provide a solution meeting in a thoroughly satisfactory manner the conflicting needs considered in the foregoing.

According to the present invention, that object is achieved by means of an arrangement having the features set forth in the annexed claims.

Essentially, the invention is based on the concept of exploiting also the "third" dimension of the component (e.g. the bias inductor) involved in order to be able to assemble a higher number of components over the same area. The third dimension in question is the height, that is the dimension of the inductor in the direction orthogonal to the general plane of the submount. As this is quite often the major dimension of the inductor, a more efficient use of space in terms of mechanical layout may be achieved, thus giving rise to smaller assemblies while making the distances between the components smaller.

Also, the inductor is preferably mounted at a location displaced laterally with respect to the lasing direction of the laser source, that is the direction of alignment of the front and back (lasing) facets of the laser. Such an arrangement of the inductor simultaneously ensures that the inductor does not impede the propagation path of the main laser beam generated by the laser source, while permitting the possible arrangement of a photodetector to collect the secondary radiation from the back facet of the laser source.

The whole of the foregoing also permits optimisation of wirebonding design especially in respect of RF performance related to reducing the very critical wirebonding length between the laser and the RF laser driver output. This in turn reduces the influence of a radio frequency (RF) and electro-magnetic interference (EMI) phenomena, thus permitting laser operation at higher speeds.

In a particularly preferred embodiment, the arrangement of invention includes a submount with a recess and at least part of the laser driver is arranged in the recess so that the driver has an end surface extending from the recess substantially flush with the pad for mounting the laser source.

Figure 2:
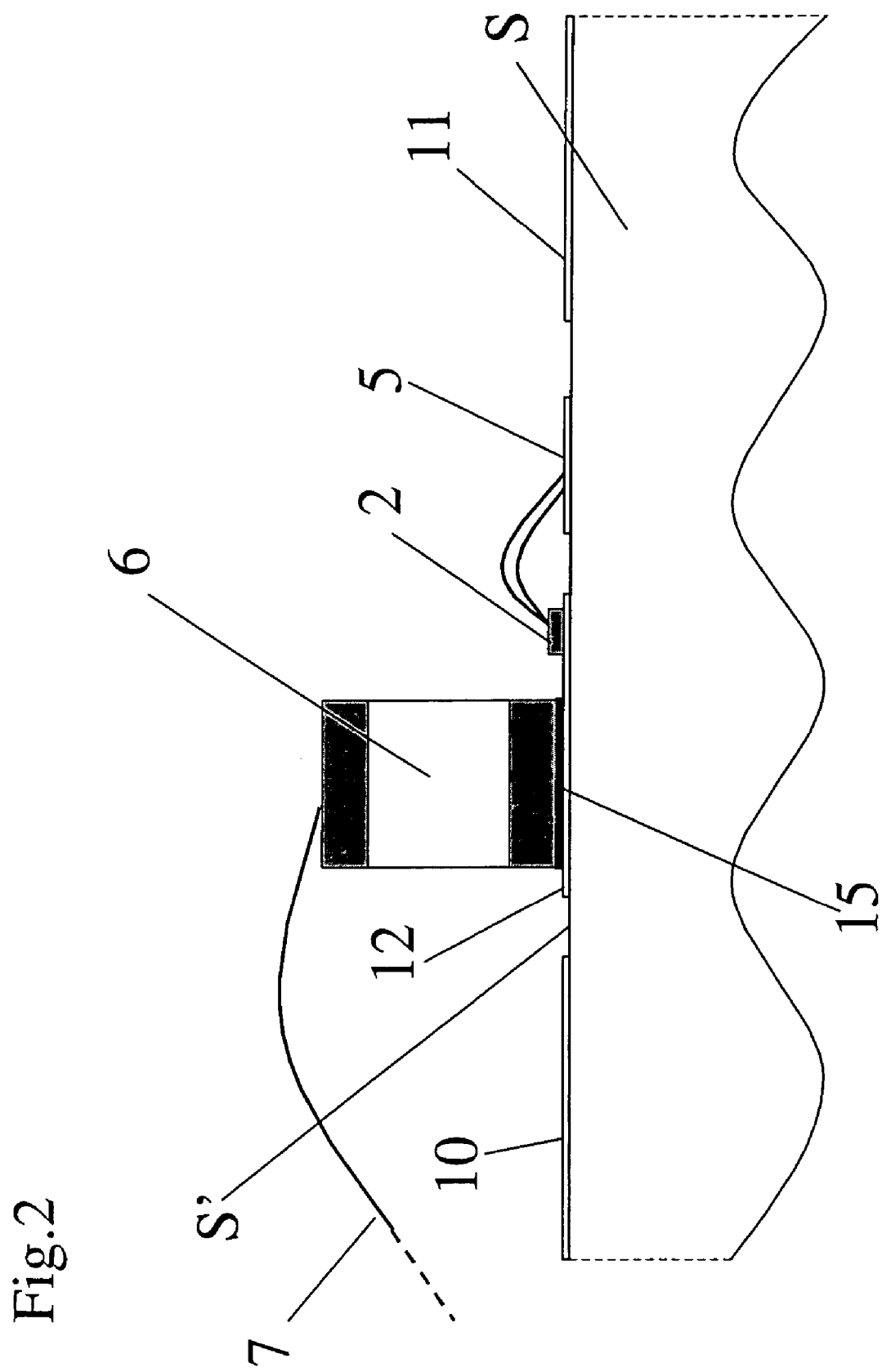

The invention will now be described, by way of example only, by referring to the enclosed drawings, wherein:

FIG. 1 is a general plan view of a submount for high-frequency components incorporating the arrangement of the invention, and FIG. 2 is a cross sectional view taken along line II-II of FIG. 1.

In FIG. 1 reference 1 indicates as a whole an assembly for a hybrid integration of an optical transmitter. This includes a semiconductor laser 2 having associated a number of ancillary units/components arranged onto a submount generally indicated S.

Semiconductor laser 2 has a main or front facet 2a from which a laser beam is generated along an axis designated X to be injected (by known means, e.g. a lens) into an optical waveguide such as an optical fiber along a substantially unimpeded propagation path.

Semiconductor laser 2 also has a back facet 2b from which a secondary laser beam is produced. The secondary laser beam may be collected and detected by an opto-electrical component, such as a photodiode, e.g. for control purposes.

The fiber and the lens comprising the optical radiation feature of transmitter 1 as well as the control photodiode hinted at in the foregoing are of a type well known in the art. Correspondingly, these were not shown in the drawing in order to avoid rendering the drawing unnecessarily complex.

Assembly 1 further includes i.a. a laser driver circuit 3 that provides laser 2 with a driver signal over a signal path. This is usually comprised of two bonding wires 4 in order to minimise the path inductance.

Reference 5 denotes a dc feed pad that, in co-operation with a bias inductance 6, defines a circuit for setting the required bias level for laser 2. Such a level is usually rendered adjustable by the laser driver unit 3 via a bias line 7.

Other sets of bonding lines collectively designated as 8 and 9 connect the laser driver circuit 3 with ground pads designated 10 and 11, respectively. These bonding lines are used for feeding the laser driver while they in fact belong to the return path for the RF signal towards ground.

Pads 5, 10 and 11 are preferably provided in the form of metallised (e.g. gold) areas over the submount S supporting the whole assembly, a substantially similar metallised area or pad 12 housing both semiconductor laser 2 and inductor 6.

Pad 12 thus provides electrical connection for the RF (e.g. 10 Gbit/s) signal path towards laser 2 via bonding wires 4 as well as for the d.c. bias path for laser 2 from pad 5 via inductor 6.

Submount S is typically of a ceramic material such as $Al_2O_3$ and preferably includes a recessed or "sunken" area 13 for mounting at least part of driver 3. Driver 3 may thus be arranged in the recess 13 so that driver 3 has its upper surface extending flush with the pad 12 for mounting laser source 2 and the other elements of the assembly. This enables the corresponding wirebonding lengths to be minimised.

As better appreciated in the cross-sectional view of FIG. 2, instead of being mounted "flat" onto pad 12, bias inductance 6 is mounted "upright", that is with its major dimension (i.e. its longer direction of extension) arranged substantially orthogonal or perpendicular to the general plane of surface S' of submount S.

This arrangement, that is inductance 6 being mounted with its longest dimension substantially orthogonal to the plane of surface S' of submount S, causes inductance 6 to have a much smaller footprint on metallised pad 12 than in the case of a flat mounting. This enables locating inductance 6 very close to laser 2 with a length reduction in the very critical wirebonding lines 4, 8, 9 of the RF path.

Inductor 6 is usually comprised of a SMD component in the form of a parallelepiped about 1-1.5 mm i.e. 1,500 micron long and roughly square end faces having sides about 500-750 micron long. Inductor 6 may thus be preferably mounted onto metallised pad 12 by resorting to a conductive glue layer 15.

As better appreciated in the plan view of FIG. 1, inductor 6 is preferably mounted at a location displaced laterally with respect to the lasing direction X of laser source 2, that is the direction of alignment of the front and back (lasing) facets 2a, 2b of the laser.

As a consequence, inductor 6 will not impede the propagation path of the main laser beam generated from the front facet 2a of laser source 2 towards the optical waveguide (not shown) into which the laser beam is injected. Possible arrangement of a photodetector to collect the secondary radiation from the back facet 2b of the laser source is also permitted while avoiding that this may result in an undesired extension of the wirebonding towards laser 2.

As used herein, inductor 6 being "displaced laterally," with respect to the lasing direction X of laser source 2 also encompasses an alternative mounting arrangement (not shown) where inductor 6 is at least partly aligned—i.e. not located as a whole side-off—with respect to lasing direction X. In such a case inductor 6 may have a face or surface possibly exposed to and likely to be impinged upon by the secondary radiation from back facet 2b of laser 2. In that case, inductor 6 is "displaced laterally" with respect to the lasing direction X by simply arranging it in such a way that such face or surface is tilted laterally with respect to lasing direction X so that any radiation from the laser back facet along direction X is reflected away from such direction and is not returned back towards the laser source.

Of course, without prejudice to the underlying principle of the invention, the details and embodiments may vary with respect to what has been described and shown by way of example only, without departing from the scope of the present invention as defined in the annexed claims.

The invention claimed is:

1. A mounting arrangement for a laser source and a bias inductance, said laser source and said bias inductance being mounted on a general plane of extension of a submount, wherein said bias inductance is mounted on said submount so that a longest dimension of said bias inductance is substantially orthogonal to said general plane of said submount, the mounting arrangement further comprising an electrically conductive area or pad for mounting said laser source as well as a driver for said laser source, and in that said submount has an outer surface and a recess recessed with respect to said outer surface, wherein at least part of said laser driver is arranged in said recess so that the driver has an end surface extending from the recess substantially flush with said conductive pad for mounting said laser source.

2. The mounting arrangement of claim 1, wherein said laser source has a lasing direction and said bias inductance is displaced laterally with respect to said lasing direction of said laser source.

3. The mounting arrangement of claim 2, wherein said laser source includes front and back lasing facets aligned along said lasing direction, said bias inductance has a surface exposed to radiation from said back facet of the laser source, and in that said surface is tilted laterally with respect to said lasing direction so that radiation from said laser back facet along said lasing direction is reflected away from such direction.

4. The mounting arrangement of claim 1, wherein said bias inductance is mounted onto said submount by means of conductive glue.

5. The mounting arrangement of claim 1, wherein said bias inductance is in the form of an SMD component.

6. A mounting arrangement comprising:
a laser source;
at least one auxiliary component associated with said laser source, said at least one auxiliary component having a major dimension;

a submount having a general plane of extension, an outer surface and a recess recessed with respect to said outer surface;

an electrically conductive area or pad for mounting said laser source; and a driver for said laser source, wherein said laser source and said auxiliary component are mounted on said general plane of extension of said submount, and said at least one auxiliary component is mounted with said major dimension substantially orthogonal to said general plane of said submount, and wherein at least part of said laser driver is arranged in said recess so that the driver has an end surface extending from the recess substantially flush with said conductive pad for mounting said laser source.

7. A mounting arrangement comprising:

a submount having a general plane of extension; and a laser source, and at least one auxiliary component associated with said laser source;

wherein said laser source and said auxiliary component are mounted on said submount, wherein said at least one auxiliary component is mounted on said general plane of extension of said submount so that a longest dimension of said at least one auxiliary component is at least substantially orthogonal to said general plane of said submount, wherein said laser source has a lasing direction and said auxiliary component is displaced laterally with respect to said lasing direction of said laser source, and wherein said laser source includes front and back lasing facets aligned along said lasing direction, said auxiliary component has a surface exposed to radiation from said back facet of the laser source, and in that said surface is tilted laterally with respect to said lasing direction so that a major portion of the radiation projected from said laser back facet along said lasing direction and incident upon said surface of said auxiliary component, is reflected away from said lasing direction.

\* \* \* \* \*